(12) United States Patent
Nayak et al.

(10) Patent No.: US 11,923,869 B2
(45) Date of Patent: Mar. 5, 2024

(54) DATA STORAGE DEVICE WITH DYNAMIC MAPPING OF LOW-DENSITY PARITY CHECK (LDPC) ENGINES

(71) Applicant: Western Digital Technologies, Inc., San Jose, CA (US)

(72) Inventors: Dattatreya B Nayak, Udupi (IN); Karthik N E, Chickamagalore (IN); Noor Mohamed A A, Kumbakonam (IN); Yunas Rashid, Srinagar (IN)

(73) Assignee: Western Digital Technologies, Inc., San Jose, CA (US)

( * ) Notice: Subject to any disclaimer, the term of this patent is extended or adjusted under 35 U.S.C. 154(b) by 16 days.

(21) Appl. No.: 17/839,626

(22) Filed: Jun. 14, 2022

(65) Prior Publication Data
US 2023/0403030 A1 Dec. 14, 2023

(51) Int. Cl.
*G11C 29/00* (2006.01)
*G06F 3/06* (2006.01)
*H03M 13/11* (2006.01)

(52) U.S. Cl.
CPC ....... *H03M 13/1177* (2013.01); *G06F 3/0619* (2013.01); *G06F 3/0631* (2013.01); *G06F 3/0656* (2013.01); *G06F 3/0659* (2013.01); *G06F 3/0679* (2013.01); *H03M 13/1134* (2013.01)

(58) Field of Classification Search
CPC .... G06F 3/0619; G06F 3/0679; G06F 3/0659; G06F 3/0656; G06F 3/0631; H03M 13/1177; H03M 13/1134
See application file for complete search history.

(56) References Cited

U.S. PATENT DOCUMENTS

| | | |
|---|---|---|
| 10,171,110 B1 * | 1/2019 | Pream ................ H03M 13/1111 |
| 2013/0124945 A1 | 5/2013 | Hu et al. |
| 2015/0286528 A1 | 10/2015 | Cai et al. |
| 2016/0006462 A1 | 1/2016 | Hanham et al. |
| 2019/0007070 A1 | 1/2019 | Pream et al. |
| 2019/0087322 A1 | 3/2019 | Bi |
| 2019/0164610 A1 * | 5/2019 | Zamir ................... G06F 11/108 |
| 2019/0198114 A1 * | 6/2019 | Ben-Rubi .......... G11C 16/3459 |

* cited by examiner

*Primary Examiner* — Samir W Rizk
(74) *Attorney, Agent, or Firm* — Michael Best & Friedrich LLP

(57) ABSTRACT

The devices, methods, and apparatuses of the present disclosure address a lack of parallelism in a typical approach by eliminating the static mapping of the two or more low-density parity check (LDPC) engines to a plurality of flash controllers. The devices, methods, and apparatuses of the present disclosure include a dynamic LDPC mapping to the plurality of flash controllers.

20 Claims, 4 Drawing Sheets

DATA STORAGE DEVICE WITH DYNAMIC MAPPING OF LOW-DENSITY PARITY CHECK (LDPC) ENGINES

FIELD

This application relates generally to data storage devices, and more particularly, to data storage devices with a dynamic mapping of low-density parity check (LDPC) engines.

BACKGROUND

SSD architectures may support two or more Low Density Parity Check (LDPC) engines that perform scrambling, encoding, and decoding operations for device read and write operations. These LDPC engines may be mapped statically to low-level device drivers (also referred to as flash controllers or "FCs") that communicate with a memory device. However, the parallelism from a Flash Translation Layer (FTL) might not always result in satisfactory performance with multiple LDPC engines, as different LDPC engines might be operating at different speeds or doing different tasks.

SUMMARY

With the demand for increasing storage capacity in consumer storage products, achieving parallelism within device and subsequently enhanced device input/output (I/O) is becoming more important. However, typically, the FTL does not consider the LDPCs when scheduling operations, which may result in data storage devices with multiple LDPCs having one LDPC being idle and one or more LDPC being completely occupied.

The devices, methods, and apparatuses of the present disclosure address this lack of parallelism in the typical approach by eliminating the static mapping of the two or more LDPCs to the FCs. Instead, the devices, methods, and apparatuses of the present disclosure include a dynamic mapping of the LDPCs to the FCs that is not known to the FTL One embodiment of the present disclosure includes a data storage device. The data storage device includes a memory and a data storage controller. The memory including a plurality of memory dies, and support circuitry configured to support memory operations at the plurality of memory dies, the support circuitry including a plurality of low-density parity check (LDPC) engines and a plurality of flash controllers (FCs), each of the plurality of FCs corresponding to one of the plurality of memory dies. The data storage controller including an interface and a flash translation layer (FTL). The data storage controller is configured to control the interface to output the memory operations to the memory using the FTL and a bus. The support circuitry is configured to dynamically map the plurality of LDPC engines to the plurality of FCs Another embodiment of the present disclosure includes a method. The method includes outputting, with a data storage controller including an interface and a flash translation layer (FTL), memory operations to a memory including a plurality of memory dies and support circuitry including a plurality of low-density parity check (LDPC) engines and a plurality of flash controllers (FCs), each of the plurality of FCs corresponding to one of the plurality of memory dies. The method also includes dynamically mapping, with the support circuitry, the plurality of LDPC engines to the plurality of FCs.

Yet another embodiment of the present disclosure includes an apparatus. The apparatus includes means for outputting memory operations to a memory including a plurality of memory dies and support circuitry including a plurality of low-density parity check (LDPC) engines and a plurality of flash controllers (FCs), each of the plurality of FCs corresponding to one of the plurality of memory dies. The apparatus also includes means for dynamically mapping the plurality of LDPC engines to the plurality of FCs.

Various aspects of the present disclosure provide for improvements in data storage devices. The present disclosure can be embodied in various forms, including hardware or circuits controlled by software, firmware, or a combination thereof. The foregoing summary is intended solely to give a general idea of various aspects of the present disclosure and does not limit the scope of the present disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the controller can be performed by hardware (for example, analog or digital circuits), a combination of hardware and software (for example, program code or firmware stored in a non-transitory computer-readable medium that is executed by a processor or control circuitry), or any other suitable means. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein may be applicable to other types of solid-state memory, such as NOR, PCM ("Phase Change Memory"), ReRAM, or other suitable solid-state memory.

Figure 1:
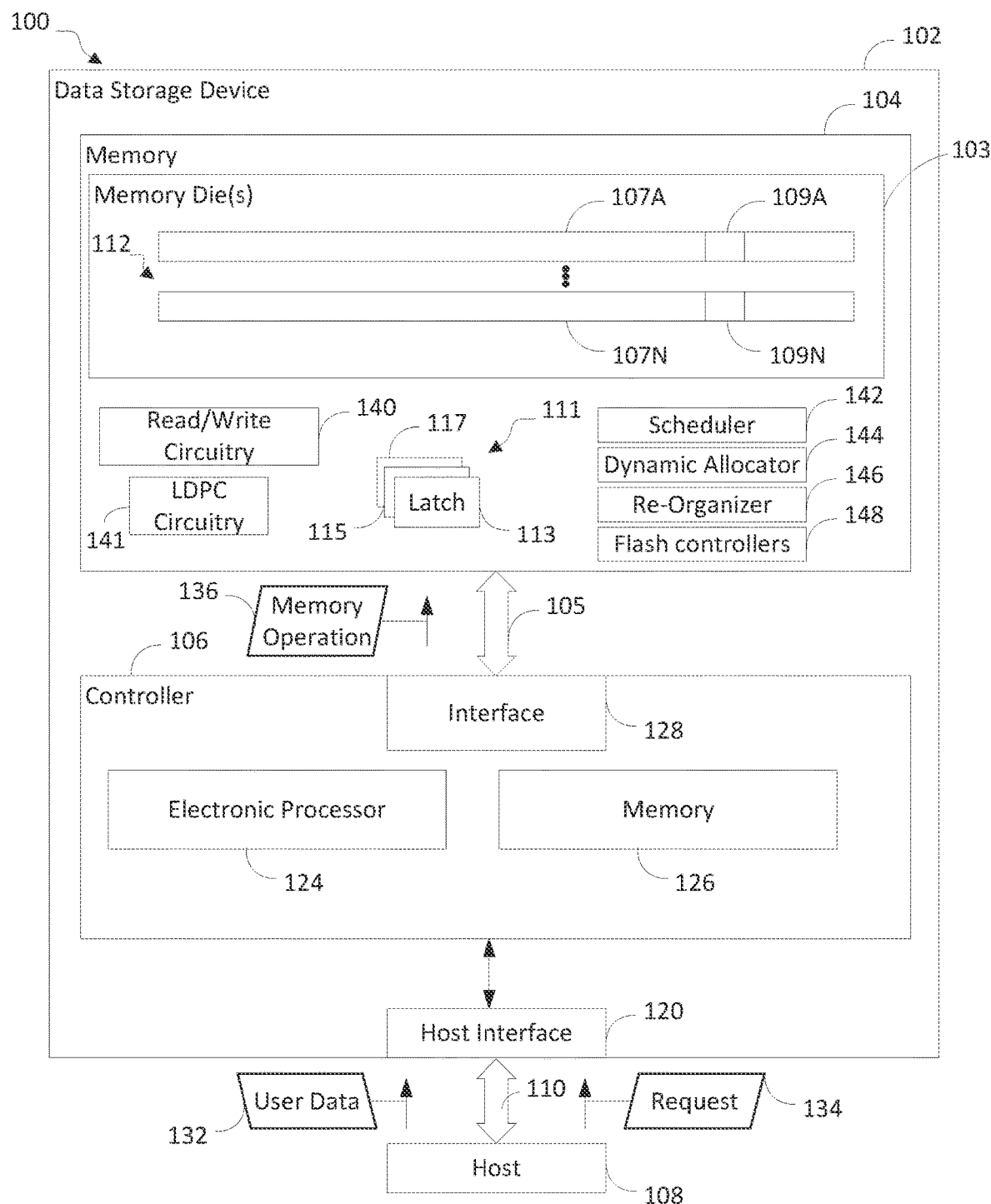
FIG. 1 is block diagram of a system including a data storage device and a host device, in accordance with some embodiments of the disclosure.

FIG. 1 is block diagram of a system including a data storage device and a host device, in accordance with some embodiments of the disclosure. In the example of FIG. 1, the system 100 includes a data storage device 102 in communication with a host device 108. The data storage device 102 includes a memory 104 (e.g. non-volatile memory) that is coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled with a connection (e.g., a communication path 110), such as a bus or a wireless connection. In some examples, the data storage device 102 may be embedded within the host device 108. Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 108 with the communication path 110, such as a wired communication path and/or a wireless communication path. For example, the data storage device 102 may include an interface 120 (e.g., a host interface) that enables communication with the communication path 110 between the data storage device 102 and the host device 108, such as when the interface 120 is communicatively coupled to the host device 108.

The host device 108 may include a processor and a memory. The memory may be configured to store data and/or instructions that may be executable by the processor. The memory may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory 104 of the data storage device 102. For example, the host device 108 may be configured to provide data, such as user data 132, to be stored at the memory 104 or to request data to be read from the memory 104. The host device 108 may include a mobile smartphone, a music player, a video player, a gaming console, an electronic book reader, a personal digital assistant (PDA), a computer, such as a laptop computer or notebook computer, any combination thereof, or other suitable electronic device.

The host device 108 communicates with a memory interface that enables reading from the memory 104 and writing to the memory 104. In some examples, the host device 108 may operate in compliance with an industry specification, such as a Universal Flash Storage (UFS) Host Controller Interface specification. In other examples, the host device 108 may operate in compliance with one or more other specifications, such as a Secure Digital (SD) Host Controller specification or other suitable industry specification. The host device 108 may also communicate with the memory 104 in accordance with any other suitable communication protocol.

The memory 104 of the data storage device 102 may include a non-volatile memory (e.g., NAND flash, BiCS family of memories, or other suitable solid-state memory). In some examples, the memory 104 may be any type of flash memory. For example, the memory 104 may be two-dimensional (2D) memory or three-dimensional (3D) flash memory. The memory 104 may include one or more memory dies 103. Each of the one or more memory dies 103 may include one or more memory blocks 112 (e.g., one or more erase blocks). Each memory block 112 may include one or more groups of storage elements, such as a representative group of storage elements 107A-107N. The group of storage elements 107A-107N may be configured as a wordline. The group of storage elements 107A-107N may include multiple storage elements (e.g., memory cells that are referred to herein as a "string"), such as a representative storage elements 109A and 109N, respectively.

The memory 104 may include one or more latches (e.g., a set of latches 111 including latches 113, 115, and 117). The latches hold data to be transferred to the controller 106.

The memory 104 may also include support circuitry, such as read/write circuitry 140, low-density parity check ("LDPC") circuitry 141, scheduler 142, dynamic allocator 144, re-organizer 146, and flash controllers 148 to support operation of the one or more memory dies 103. Although depicted as individual components, some of the support circuitry may be further divided into separate components of the memory 104, such as read circuitry and write circuitry.

The read/write circuitry 140 may be external to the one or more memory dies 103 of the memory 104. Alternatively, one or more individual memory dies 103 may include corresponding read/write circuitry 140 that is operable to read from and/or write to storage elements within the individual memory die independent of any other read and/or write operations at any of the other memory dies.

The scheduler 142 receives die operations from a flash translation layer (FTL) with assigned priority levels and adds required information. The required information may be internal bookkeeping information, for example, memory address information and/or decision making information. The scheduler 142 then submits the die operations with the added information to the corresponding die with the dynamic allocator 144.

The dynamic allocator 144 receives the die operations with the assigned priority levels the added information from the scheduler 142. The dynamic allocator 144 includes a priority queue and allocates the die operations to the LDPC circuitry 141 into the priority queue based on the assigned priority levels. Additionally, as explained in greater detail in FIG. 3, the dynamic allocator 144 may also allocate the die operations to the LDPC circuitry 141 into the priority queue based on feedback information from the LDPC circuitry 141 in addition to the assigned priority levels.

The LDPC circuitry 141 may be two or more LDPC engines. Each LDPC engine is configured to perform scrambling, encoding, and decoding operations for device read and write operations at the memory dies 103. Accordingly, the LDPC circuitry 141 is configured to perform parity checking and/or error correction on data being transferred to or from the memory dies 103. The LDPC circuitry 141 outputs the data that has been parity checked and/or error corrected to the re-organizer 146.

With respect to write operations, the re-organizer 146 reorganizes the data that has been received from the LDPC circuitry 141, and stores this data into one of a plurality of memory buffers. Each of the plurality of memory buffers corresponds to one of a plurality of flash controllers 148 and each of the plurality of memory buffers outputs this data to the corresponding one of the plurality of flash controllers 148.

Additionally, with respect to write operations, the plurality of flash controllers 148 receives the data from the re-organizer 146. The plurality of flash controllers 148 control corresponding dies of the memory dies 103 to store the data that has been parity checked and/or error corrected by the LDPC circuitry 141.

With respect to read operations, the plurality of flash controllers 148 receives raw data from the memory dies 103 and provides the raw data to the re-organizer 146. The re-organizer 146 stores the raw data in the corresponding memory buffers. The re-organizer 146 also notifies the dynamic allocator 144 about the location of the raw data that is being moved from the memory dies 103 to the host device 108 in the re-organizer 146. The re-organizer 146, at the command of the dynamic allocator 144, then provides the raw data to the LDPC circuitry 141, where the raw data will be decoded and parity checked before being sent to the host device 108.

Additionally, with respect to read operations, a sense request (from the memory dies 103 to the re-organizer 146) and a transfer request (from the re-organizer 146 to the host device 108/other memory) are parts of the read operation. The two requests are sent separately, where the transfer request is sent after the sense request is completed. The LDPC circuitry 141 is used during the transfer request, and the dynamic allocation occurs during the transfer request.

The controller 106 is coupled to the memory 104 with an interface 128 and a bus 105, another structure, or a combination thereof. For example, the bus 105 may include multiple distinct channels to enable the interface 128 to communicate with each of the one or more memory dies 103 in parallel with, and independently of, communication with the other memory dies 103.

The controller 106 may include a queue manager and/or the FTL as described above. The controller 106 may generate the sense/transfer or program operations to the memory 104. The controller 106 with the interface 128 interacts with the memory 104 by sending commands (i.e., the die operations) and receiving data transfers from the memory 104.

The controller 106 is configured to receive data and instructions from the host device 108 and to send data to the host device 108. For example, the controller 106 may send data to the host device 108 with the interface 120, and the controller 106 may receive data from the host device 108 with the interface 120. The controller 106 is configured to send data and commands (e.g., the memory operation 136, which may be a cycle operation of a memory block of the memory 104) to the memory 104 and to receive data from the memory 104. For example, the controller 106 is configured to send data and a program or write command to cause the memory 104 to store data to a specified address of the memory 104. The write command may specify a physical address of a portion of the memory 104 (e.g., a physical address of a word line of the memory 104) that is to store the data.

The controller 106 is configured to send a read command to the memory 104 to access data from a specified address of the memory 104. The read command may specify the physical address of a region of the memory 104 (e.g., a physical address of a word line of the memory 104). The controller 106 may also be configured to send data and commands to the memory 104 associated with background scanning operations, garbage collection operations, and/or wear-leveling operations, or other suitable memory operations.

The controller 106 may include a processor 124 and a memory 126. The memory 126 may be configured to store data and/or instructions that may be executable by the processor 124.

The controller 106 may control the interface 128 to send the memory operation 136 (e.g., a read command) to the memory 104. In some examples, the controller 106 may control the interface 128 to send the memory operation 136 to cause the read/write circuitry 140 to sense data stored in a storage element when the memory operation 136 is a read command. For example, the controller 106 may control the interface 128 to send the read command to the memory 104 in response to receiving a request for read access from the host device 108. In response to receiving the read command, the memory 104 may sense the storage element 107A (e.g., using the read/write circuitry 140) to generate one or more sets of bits representing the stored data.

In other examples, the controller 106 may control the interface 128 to send the memory operation 136 to cause the read/write circuitry 140 to store data in a storage element when the memory operation 136 is a write command with the data for storage. For example, the controller 106 may control the interface 128 to send the write command and the data to the memory 104 in response to receiving a request for write access by the host device 108.

Figure 2:
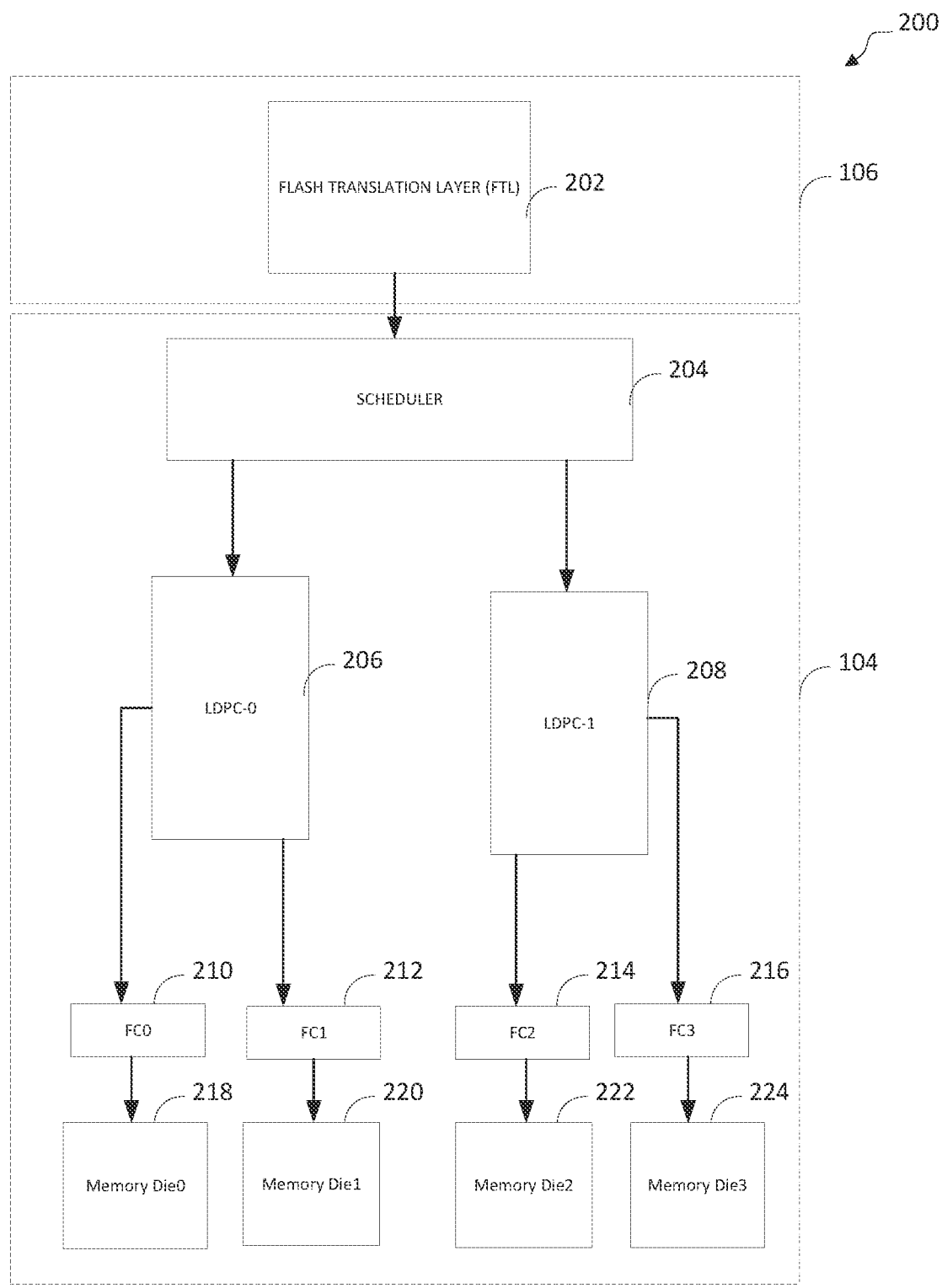
FIG. 2 is a block diagram illustrating a comparative example of LDPCs statically-mapped to FCs.

FIG. 2 is a block diagram illustrating a comparative example 200 of LDPCs statically-mapped to FCs. In FIG. 2, the comparative example 200 includes a Flash Translation Layer (FTL) 202, a scheduler 204, a first Low-Density Parity Check (LDPC-0) 206, a second Low-Density Parity Check (LDPC-1) 208, a first flash controller (FC0) 210, a second flash controller (FC1) 212, a third flash controller (FC2) 214, a fourth flash controller (FC3) 216, a first memory die (Die0) 218, a second memory die (Die1) 220, a third memory die (Die2) 222, and a fourth memory die (Die3) 224.

The scheduler 204 may correspond to the scheduler 142 of FIG. 1. The first Low-Density Parity Check (LDPC-0) 206 and the second Low-Density Parity Check (LDPC-1) 208 may correspond to the LDPC circuitry 141 of FIG. 1. The first flash controller (FC0) 210, the second flash controller (FC1) 212, the third flash controller (FC2) 214, the fourth flash controller (FC3) 216 may correspond to the flash controllers 148 of FIG. 1. The first memory die (Die0) 218, the second memory die (Die1) 220, the third memory die (Die2) 222, and the fourth memory die (Die3) 224 may correspond to the memory dies 103 of FIG. 1. Therefore, redundant description of these components is not repeated herein.

As illustrated in FIG. 2, the FTL 202 determines one memory die from the memory dies 218-224 to engage with a memory operation. For example, the FTL 202 may determine to engage the memory die 218 with a memory operation. However, when the FTL 202 determines to engage the memory die 218 with a memory operation, then the FTL 202 also determines one LDPC (i.e., the LDPC 206) from the LDPCs 206 and 208 and one FC (i.e., the FC 210) from the FCs 210-216 to also engage with the memory operation because the memory die 218 is controlled by the FC 210 that is statically mapped to the LDPC 206.

The static mapping of the LDPC and FC is due to the design of the LDPC and FC interaction. Further, vertical scaling of the memory dies may result in more capacity, but not more parallelism, as the memory dies are linked to the same FC. Furthermore, horizontal scaling, by increasing FCs will result in more capacity and more parallelism, and as a result better device performance. However, increasing FCs will also result in a corresponding increase in LDPCs because the FCs are statically-mapped to the LDPCs. In the comparative example 200, every two additional FCs will require an additional LDPC.

Moreover, another major drawback of the comparative example 200 is that the LDPCs 206 and 208 are not considered by the FTL 202 when controlling the scheduler 204 to schedule the memory operations. In certain instances, one of the LDPCs 206 and 208 may be idle while the other is completely occupied because the FTL 202 does not consider the scheduled operations at the individual LDPCs 206 and 208.

Figure 3:
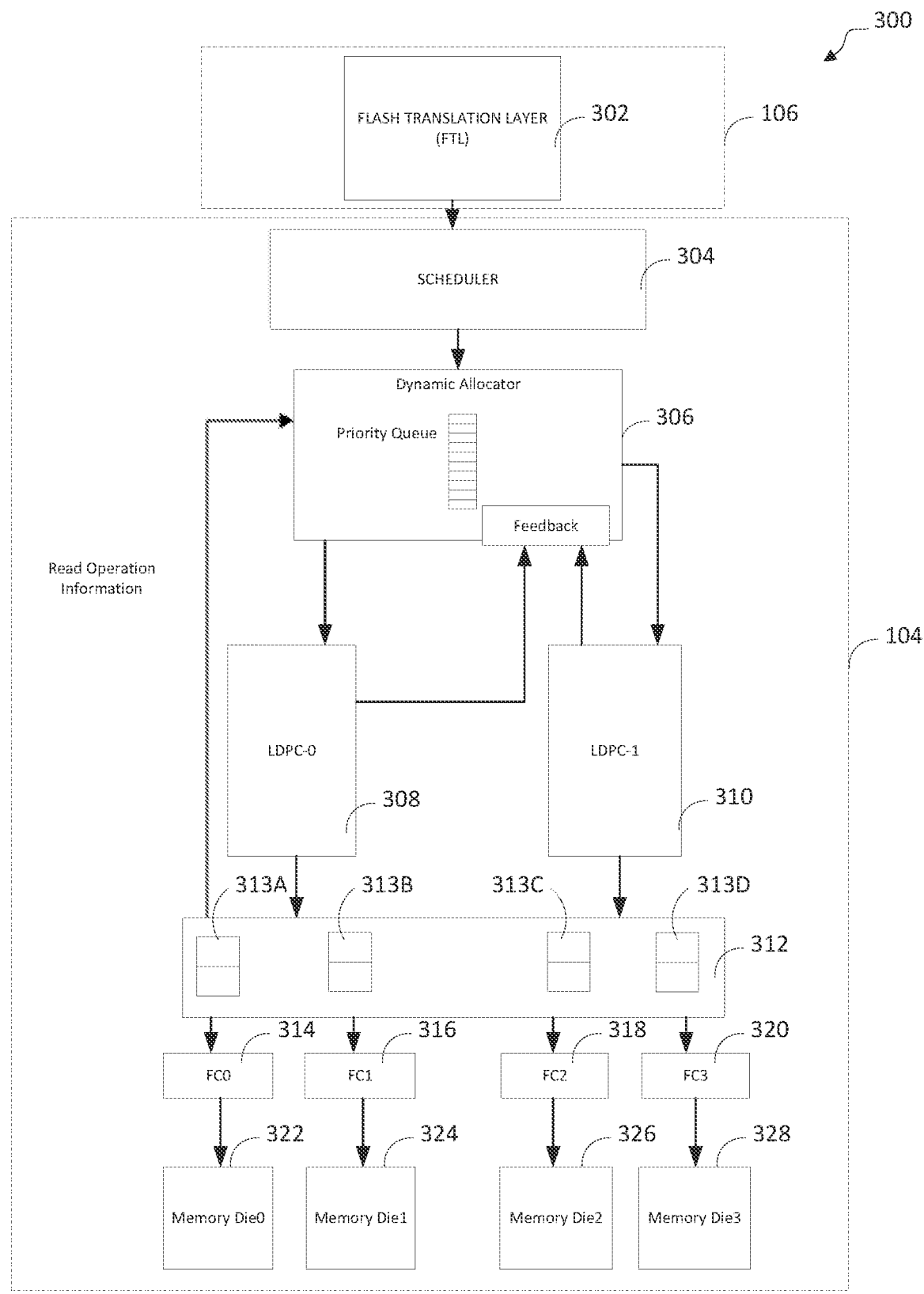
FIG. 3 is a diagram illustrating an example of LDPCs dynamically-mapped to FCs, in accordance with various aspects of the present disclosure.

FIG. 3 is a diagram illustrating an example 300 of LDPCs dynamically-mapped to FCs, in accordance with various aspects of the present disclosure. The example 300 maximizes LDPC throughput by replacing the static mapping of the comparative example 200 with dynamic mapping.

In FIG. 3, the example 300 includes a Flash Translation Layer (FTL) 302, a scheduler 304, a dynamic allocator 306, a first Low-Density Parity Check (LDPC-0) 308, a second Low-Density Parity Check (LDPC-1) 310, a re-organizer 312, a first flash controller (FC0) 314, a second flash controller (FC1) 316, a third flash controller (FC2) 318, a fourth flash controller (FC3) 320, a first memory die (Die0) 322, a second memory die (Die1) 324, a third memory die (Die2) 326, and a fourth memory die (Die3) 328.

The scheduler 304 may correspond to the scheduler 142 of FIG. 1. The dynamic allocator 306 may correspond to the dynamic allocator 144 of FIG. 1. The first Low-Density Parity Check (LDPC-0) 308 and the second Low-Density Parity Check (LDPC-1) 310 may correspond to the LDPC circuitry 141 of FIG. 1. The re-organizer 312 may correspond to the re-organizer 146 of FIG. 1. The first flash controller (FC0) 314, the second flash controller (FC1) 316, the third flash controller (FC2) 318, and the fourth flash controller (FC3) 320 may correspond to the flash controllers 148 of FIG. 1. The first memory die (Die0) 322, the second memory die (Die1) 324, the third memory die (Die2) 326, and the fourth memory die (Die3) 328 may correspond to the memory dies 103 of FIG. 1. Therefore, redundant description of these components is not repeated herein.

Additionally, while the example 300 illustrates the FTL 302 as corresponding to the controller 106 of FIG. 1 and everything else in FIG. 3 corresponding to the memory 104 of FIG. 1, this illustration is for ease of understanding and does not limit the example 300. The components of the example 300 may be arranged in various ways, for example, some of the scheduler 304, the dynamic allocator 306, the first Low-Density Parity Check (LDPC-0) 308, the second Low-Density Parity Check (LDPC-1) 310, the re-organizer 312, the first flash controller (FC0) 314, the second flash controller (FC1) 316, the third flash controller (FC2) 318, and the fourth flash controller (FC3) 320 may instead correspond to the controller 106 of FIG. 1.

As illustrated in FIG. 3, the FTL 302 submits die operations to the scheduler 304. The scheduler 304 then submits the same die operation to the corresponding die after adding required information. The required information may be internal bookkeeping information, for example, memory address information and/or decision making information.

As part of submitting the same die operation to the corresponding die after adding the required information, the scheduler 304 provides the die operation to the dynamic allocator 306, and the dynamic allocator 306 tags each LDPC operation with a corresponding FC. The tagging of each LDPC operation with a corresponding FC allows the re-organizer 312 to identify the corresponding FC.

The dynamic allocator 306 includes a priority queue (i.e., a data structure) that holds the requests from the FTL 302. The priority conditions may also be provided to the priority queue either predefined or the FTL 302 may provide the priority conditions. In some examples, the FTL 302 may provide the priority conditions because the FTL 302 may want to prioritize the receipt of certain information.

The priority mechanism may be First Come First Serve (FCFS). Further, when the FTL 302 requires any additional priority, the additional priority may be accommodated.

The priority queue may also be a hardware component or a software component. Additionally, to ensure no starvation for lower priority requests, if any, the dynamic allocator 306 may have an upper-limit for priority re-ordering.

Additionally, the dynamic allocator 306 also includes a feedback section. The feedback section monitors have long a given LDPC takes to complete an operation. Information from the feedback section may be used in selecting one of the LDPCs for the next operation. Further, priority operations, starvation, and other feedback information may be logged in the feedback section and used when required.

The re-organizer 312 includes a plurality of memory buffer sets 313A-313D. The re-organizer 312 places the result of the LDPC 308 or the LDPC 310 in a corresponding memory or a shared memory. For read operations, the re-organizer 312 may also notify the dynamic allocator 306 about the location of raw NAND data in the memory. This notification assumes the FTL 302 will send a read operation in two-step fashion: sense and transfer. During a sense operation, data will be moved from NAND to memory. During a transfer operation, data will be decoded and sent to a host, where decoding requires the LDPC 308 or the LDPC 310.

As illustrated in FIG. 3, each of the plurality of memory buffer sets 313A-313D has two memory buffers for each of the FCs 314-320. However, in other examples, each of the plurality of memory buffer sets 313A-313D may have more than two memory buffers for each of the FCs 314-320.

In the example 300, each of the LDPC 308 and the LDPC 310 self-monitors its workload and requests the next operation from the priority queue. In the example 300, each of the LDPC 308 and the LDPC 310 may have a queue depth of 1. In other words, once the LDPC 308 or the LDPC 310 completes an operation first, the LDPC 308 or the LDPC 310 may fetch the next operation from the priority queue, which will be the highest priority request in the priority queue. Alternatively, in other examples, the dynamic allocator 306 may perform the task of monitoring.

The priority queue in the dynamic allocator 306 allows a plurality of LDPCs to be used in tandem even when requests from the FTL 302 are directed to a single one of the plurality of LDPCs. Additionally, in some examples, when one of the plurality of LDPCs is in a failed state (e.g., the LDPC 308), the other LDPCs (e.g., the LDPC 310) in the plurality of LDPCs may continue operations even when the one LDPC is in the failed state. In these examples, attempts to revive the failed LDPC may be performed in parallel to operations by a remainder of the plurality of LDPCs being performed.

With respect to FIG. 2, assuming the FTL 202 has sent Die2 Write (OP0), Die3 Write (OP1), and Die3 Write (OP2), the order of operations is at time T0: the LDPC 310 performing OP0, at time T1: the LDPC 310 performing OP1, and at time T2: the LDPC 310 performing OP2. However, with respect to FIG. 3, assuming the FTL 302 has sent Die2 Write (OP0), Die3 Write (OP1), and Die3 Write (OP2), the order of operations is at time T0: the LDPC 308 performing OP0 and the LDPC 310 performing OP1, and at time T2: the LDPC 310 performing OP2. The re-organizer 312 is responsible for storing the result in appropriate memory in its buffer for the corresponding FC.

When the LDPC 308 has 30 operations in queue (30% full, assuming a 100 operation queue) and the LDPC 310 has 40 operations in queue (40% full, assuming a 100 operation queue), the scheduler 304 would typically assign a high priority operation OP0 to LDPC 308 because its queue is less full than the queue of the LDPC 310. However, different operations may take different amounts of time to complete. For example, when the 30 operations in the LDPC 308 take longer to complete relative to the 40 operations in the LDPC 310, then the LDPC 310 will be free sooner than the LDPC 308, and the high priority operation OP0 will be stuck in the LDPC 308.

To account for different operations taking different amounts of time to complete, dynamic allocator 306 may monitor the priority queue for new requests. The dynamic allocator 306 will assign the high priority operation OP0 to the LDPC that is free first (in the above example, the LDPC 310) because the queue of the LDPC 310 is empty before the LDPC 308.

Additionally, in some examples, the FTL 302 may assign different levels of priority and the self-monitoring mechanism may be performed based on the different levels of priority. For example, the dynamic allocator 306 may assign the high priority operation OP0 to be performed next in the next available LDPC. However, the dynamic allocator 306 may assign lower level priorities to be performed later in the next available LDPC, and assign the lowest level priorities to be performed at a specific LDPC even when another LDPC is available.

In other examples, the FTL 302 may not assign the operations any different levels of priority. In these examples, the dynamic allocator 306 may assign operations to just be performed next in the next available LDPC.

Figure 4:
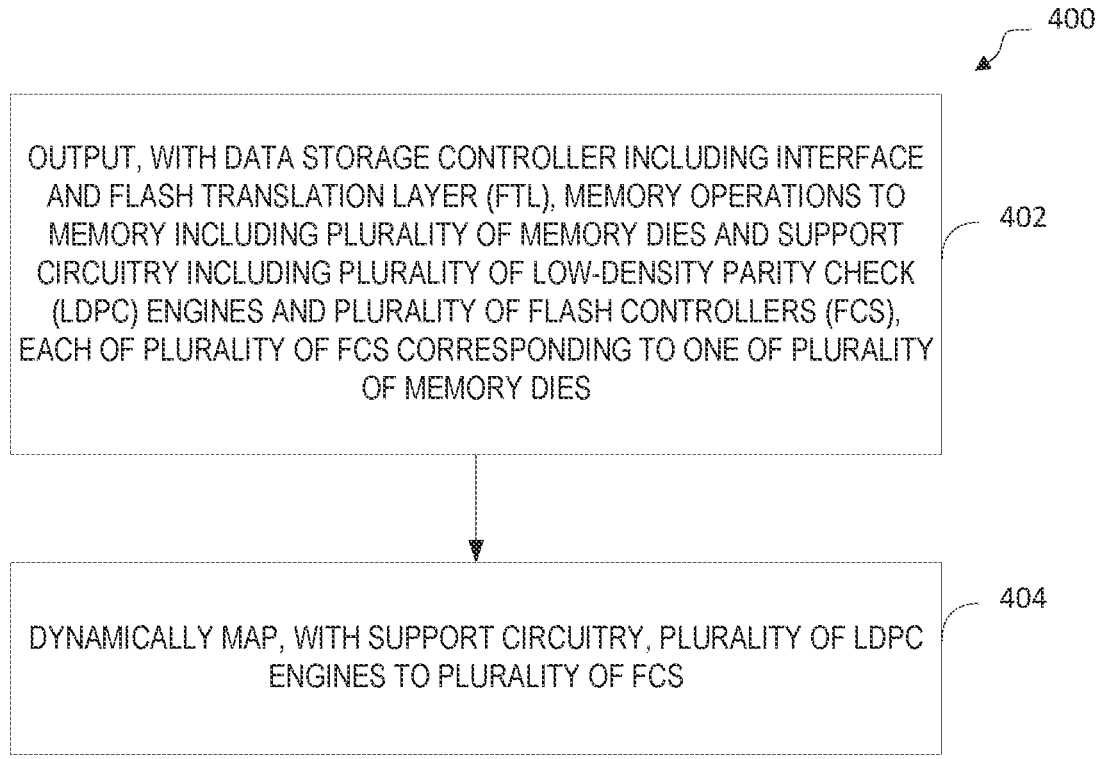
FIG. 4 is a flowchart illustrating an example process for dynamically-mapping LDPCs to FCs, in accordance with various aspects of the present disclosure.

FIG. 4 is a flowchart illustrating an example process 400 for dynamically-mapping LDPCs to FCs, in accordance with various aspects of the present disclosure. FIG. 4 is described with respect to FIG. 1.

The example process 400 includes outputting, with a data storage controller including an interface and a flash translation layer (FTL), memory operations to a memory including a plurality of memory dies and support circuitry including a plurality of low-density parity check (LDPC) engines and a plurality of flash controllers (FCs), each of the plurality of FCs corresponding to one of the plurality of memory dies (at block 402). For example, the controller 106 outputs, with the interface 128, memory operations to the memory 104 including the memory dies 103 and support circuitry including the LDPC circuitry 141 and the plurality of flash controllers (FCs) 148, each of the plurality of FCs 148 corresponding to one of the memory dies 103.

The example process 400 also includes dynamically mapping, with the support circuitry, the plurality of LDPC engines to the plurality of FCs (at block 404). For example, the dynamic allocator 144 and the re-organizer 146 dynamically map the LDPC circuitry 141 to the plurality of FCs 148.

In some examples, the example process 400 further includes receiving the memory operations from the interface, adding required information to the memory operations, and storing the memory operations in a priority queue based on priority information.

In some examples, the support circuitry further includes a plurality of memory buffers, and dynamically mapping the plurality of LDPC engines to the plurality of FCs further includes: dynamically allocating the memory operations that are stored in the priority queue to the plurality of LDPC engines, performing parity checking and error correction on the memory operations that have been dynamically allocated to the plurality of LDPC engines, storing the memory operations that have been parity checked and error corrected in the plurality of memory buffers, each memory buffer corresponding to one of the plurality of FCs, retrieving, with the each of the plurality of FCs, a memory operation that is stored in one of the plurality of memory buffers, and performing, with the each of the plurality of FCs, the memory operation at the corresponding one of the plurality of memory dies.

In some examples, the example process 400 further includes receiving feedback information from the plurality of LDPC engines, and dynamically allocating the memory operations that are stored in the priority queue to the plurality of LDPC engines based on the feedback information. In these examples, the feedback information may indicate a load level of each of the plurality of LDPC engines.

In some examples, the memory operation is a read operation, and the example process 400 further includes transferring data that is read from the corresponding one of the plurality of memory dies to a second one of the plurality of memory buffers. In these examples, the example process 400 may further include dynamically allocating the data that are stored in the second one of the plurality of memory buffers to the plurality of LDPC engines, decoding, with the plurality of LDPC engines, the data that has been dynamically allocated to the plurality of LDPC engines, and outputting the data that is decoded to a plurality of latches.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage device comprising:
a memory including
a plurality of memory dies, and
support circuitry configured to support memory operations at the plurality of memory dies, the support circuitry including a plurality of low-density parity check (LDPC) engines and a plurality of flash controllers (FCs), each of the plurality of FCs corresponding to one of the plurality of memory dies; and
a data storage controller including an interface and a flash translation layer (FTL), the data storage controller is configured to control the interface to output the memory operations to the memory using the FTL and a bus,
wherein the support circuitry is configured to dynamically map the plurality of LDPC engines to the plurality of FCs.

2. The data storage device of claim 1, wherein the support circuitry further includes a scheduler and a dynamic allocator, and
wherein the support circuitry is further configured to:
receive, with the scheduler, the memory operations from the interface,
add, with the scheduler, required information to the memory operations, and store, with the dynamic allocator, the memory operations in a priority queue of the dynamic allocator based on priority information.

3. The data storage device of claim 2, wherein the support circuitry further includes a re-organizer, and
wherein, to dynamically map the plurality of LDPC engines to the plurality of FCs, the support circuitry is further configured to:
dynamically allocate, with the dynamic allocator, the memory operations that are stored in the priority queue to the plurality of LDPC engines,
perform, with the plurality of LDPC engines, parity checking and error correction on the memory operations that have been dynamically allocated to the plurality of LDPC engines,
store, with the re-organizer, the memory operations that have been parity checked and error corrected in a plurality of memory buffers, each memory buffer corresponding to one of the plurality of FCs,
retrieve, with the each of the plurality of FCs, a memory operation that is stored in one of the plurality of memory buffers, and
perform, with the each of the plurality of FCs, the memory operation at the corresponding one of the plurality of memory dies.

4. The data storage device of claim 3, wherein the support circuitry is further configured to:
receive, with the dynamic allocator, feedback information from the plurality of LDPC engines, and
dynamically allocate, with the dynamic allocator, the memory operations that are stored in the priority queue to the plurality of LDPC engines based on the feedback information.

5. The data storage device of claim 4, wherein the feedback information indicates a load level of each of the plurality of LDPC engines.

6. The data storage device of claim 3, wherein the memory operation is a read operation, and wherein the support circuitry is further configured to:
transfer, with the each of the plurality of FCs, data that is read from the corresponding one of the plurality of memory dies to a second one of the plurality of memory buffers, and
output, with the re-organizer, a location of the corresponding one of the plurality of memory dies to the dynamic allocator.

7. The data storage device of claim 6, wherein the support circuitry is further configured to:
dynamically allocate, with the dynamic allocator, the data that are stored in the second one of the plurality of memory buffers to the plurality of LDPC engines,
perform, with the plurality of LDPC engines, decoding of the data that has been dynamically allocated to the plurality of LDPC engines, and
output the data that is decoded to a plurality of latches.

8. A method comprising:
outputting, with a data storage controller including an interface and a flash translation layer (FTL), memory operations to a memory including a plurality of memory dies and support circuitry including a plurality of low-density parity check (LDPC) engines and a plurality of flash controllers (FCs), each of the plurality of FCs corresponding to one of the plurality of memory dies; and
dynamically mapping, with the support circuitry, the plurality of LDPC engines to the plurality of FCs.

9. The method of claim 8, further comprising:
receiving the memory operations from the interface;
adding required information to the memory operations; and
storing the memory operations in a priority queue based on priority information.

10. The method of claim 9, wherein the support circuitry further includes a plurality of memory buffers, and
wherein dynamically mapping the plurality of LDPC engines to the plurality of FCs further includes:
dynamically allocating the memory operations that are stored in the priority queue to the plurality of LDPC engines,
performing parity checking and error correction on the memory operations that have been dynamically allocated to the plurality of LDPC engines,
storing the memory operations that have been parity checked and error corrected in the plurality of memory buffers, each memory buffer corresponding to one of the plurality of FCs,
retrieving, with the each of the plurality of FCs, a memory operation that is stored in one of the plurality of memory buffers, and
performing, with the each of the plurality of FCs, the memory operation at the corresponding one of the plurality of memory dies.

11. The method of claim 10, further comprising:
receiving feedback information from the plurality of LDPC engines; and
dynamically allocating the memory operations that are stored in the priority queue to the plurality of LDPC engines based on the feedback information.

12. The method of claim 11, wherein the feedback information indicates a load level of each of the plurality of LDPC engines.

13. The method of claim 10, wherein the memory operation is a read operation, the method further comprising:
transferring data that is read from the corresponding one of the plurality of memory dies to a second one of the plurality of memory buffers.

14. The method of claim 13, further comprising:
dynamically allocating the data that are stored in the second one of the plurality of memory buffers to the plurality of LDPC engines;
decoding, with the plurality of LDPC engines, the data that has been dynamically allocated to the plurality of LDPC engines; and
outputting the data that is decoded to a plurality of latches.

15. An apparatus comprising:
means for outputting memory operations to a memory including a plurality of memory dies and support circuitry including a plurality of low-density parity check (LDPC) engines and a plurality of flash controllers (FCs), each of the plurality of FCs corresponding to one of the plurality of memory dies; and
means for dynamically mapping the plurality of LDPC engines to the plurality of FCs.

16. The apparatus of claim 15, further comprising:
means for adding required information to the memory operations; and
means for storing the memory operations in a priority queue based on priority information.

17. The apparatus of claim 16, wherein the support circuitry further includes a plurality of memory buffers, and
wherein the means for dynamically mapping the plurality of LDPC engines to the plurality of memory dies further includes:

means for dynamically allocating the memory operations that are stored in the priority queue to the plurality of LDPC engines, means for performing parity checking and error correction on the memory operations that have been dynamically allocated to the plurality of LDPC engines, means for storing the memory operations that have been parity checked and error corrected in the plurality of memory buffers, each memory buffer corresponding to one of the plurality of FCs, means for retrieving a memory operation that is stored in one of the plurality of memory buffers, and means for performing the memory operation at the corresponding one of the plurality of memory dies.

18. The apparatus of claim 17, further comprising:
means for receiving feedback information from the plurality of LDPC engines; and
means for dynamically allocating the memory operations that are stored in the priority queue to the plurality of LDPC engines based on the feedback information.

19. The apparatus of claim 17, wherein the memory operation is a read operation, the method further comprising:
means for transferring data that is read from the corresponding one of the plurality of memory dies to a second one of the plurality of memory buffers.

20. The apparatus of claim 19, further comprising:
means for dynamically allocating the data that are stored in the second one of the plurality of memory buffers to the plurality of LDPC engines;

means for decoding, with the plurality of LDPC engines, the data that has been dynamically allocated to the plurality of LDPC engines; and means for outputting the data that is decoded to a plurality of latches.

* * * * *